United States Patent
Krumpelman

(10) Patent No.: US 10,162,418 B2
(45) Date of Patent: Dec. 25, 2018

(54) HAPTIC FEEDBACK WIRE MOUNT

(71) Applicant: Synaptics Incorporated, San Jose, CA (US)

(72) Inventor: Douglas Krumpelman, Winthrop, WA (US)

(73) Assignee: Synaptics Incorporaed, San Jose, CA (US)

( * ) Notice: Subject to any disclaimer, the term of this patent is extended or adjusted under 35 U.S.C. 154(b) by 11 days.

(21) Appl. No.: 15/399,599

(22) Filed: Jan. 5, 2017

(65) Prior Publication Data
US 2018/0188810 A1 Jul. 5, 2018

(51) Int. Cl.
G06F 3/033 (2013.01)
G06F 3/041 (2006.01)
H01R 13/62 (2006.01)
H01R 13/518 (2006.01)
G06F 3/01 (2006.01)
G06F 3/0354 (2013.01)
H01R 12/88 (2011.01)
H01R 12/70 (2011.01)
H01R 12/79 (2011.01)
(Continued)

(52) U.S. Cl.
CPC .......... G06F 3/016 (2013.01); G06F 3/03547 (2013.01); G06F 3/0338 (2013.01); H01R 12/7029 (2013.01); H01R 12/7058 (2013.01); H01R 12/7076 (2013.01); H01R 12/79 (2013.01); H01R 12/88 (2013.01); H01R 13/518 (2013.01); H01R 13/62 (2013.01); H01R 13/62966 (2013.01); H01R 13/62994 (2013.01); H04M 2250/22 (2013.01); H05K 7/02 (2013.01)

(58) Field of Classification Search
CPC .... G06F 3/016; G06F 3/0338; G06F 3/03547; H04M 2250/22; H01R 12/79; H01R 12/7029; H01R 12/88; H01R 12/7058; H01R 12/7076; H01R 13/62; H01R 13/518; H01R 13/62966; H01R 13/62994; H05K 7/02
See application file for complete search history.

(56) References Cited

U.S. PATENT DOCUMENTS 7,402,065 B1 * 7/2008 Polnyi ................ H01R 12/7029
411/531
8,274,487 B2 9/2012 Meier-Arendt et al.
(Continued)

Primary Examiner — Michael J Eurice
(74) Attorney, Agent, or Firm — Ferguson Braswell Fraser Kubasta PC

(57) ABSTRACT

An input device may include a wire element and a moveable substrate coupled to the wire element. The moveable substrate may include various wire alignment features. The input device may further include an input surface disposed above the moveable substrate. The input device may further include various sensor electrodes coupled to the input surface. The input device may further include a haptic actuator coupled to the moveable substrate. The haptic actuator may displace the moveable substrate in a direction substantially parallel to a plane of the input surface. The wire element may return the moveable substrate to an original position. The wire alignment features may allow, in response to an applied force by the haptic actuator and to the moveable substrate, a displacement of the moveable substrate in the direction that is substantially parallel to the plane of the input surface.

18 Claims, 9 Drawing Sheets

(51) Int. Cl.
*G06F 3/0338* (2013.01)
*H01R 13/629* (2006.01)
*H05K 7/02* (2006.01)

(56) References Cited

U.S. PATENT DOCUMENTS

| | | | |
|---|---|---|---|
| 8,633,916 B2 | 1/2014 | Bernstein et al. | |
| 9,093,235 B2 | 7/2015 | Su et al. | |
| 2007/0146348 A1* | 6/2007 | Villain | G06F 3/011 |
| | | | 345/173 |
| 2007/0273671 A1* | 11/2007 | Zadesky | G06F 3/0338 |
| | | | 345/173 |
| 2008/0202824 A1 | 8/2008 | Philipp et al. | |
| 2009/0033620 A1* | 2/2009 | Ko | G06F 3/03547 |
| | | | 345/157 |
| 2009/0244013 A1* | 10/2009 | Eldershaw | G06F 3/041 |
| | | | 345/173 |
| 2011/0141052 A1* | 6/2011 | Bernstein | G06F 3/016 |
| | | | 345/174 |
| 2011/0254786 A1* | 10/2011 | Wen | G06F 1/1616 |
| | | | 345/173 |
| 2013/0162579 A1* | 6/2013 | Modarres | B06B 1/0629 |
| | | | 345/173 |
| 2013/0194210 A1* | 8/2013 | Pfau | G06F 3/0414 |
| | | | 345/173 |
| 2013/0257776 A1* | 10/2013 | Tissot | G05G 5/06 |
| | | | 345/173 |
| 2013/0337664 A1* | 12/2013 | An | H01R 12/79 |
| | | | 439/65 |
| 2014/0015754 A1* | 1/2014 | Chang | G06F 3/0362 |
| | | | 345/168 |
| 2014/0204507 A1* | 7/2014 | Su | H01H 13/14 |
| | | | 361/679.01 |
| 2016/0188048 A1* | 6/2016 | Tan | G06F 3/047 |
| | | | 345/174 |

* cited by examiner

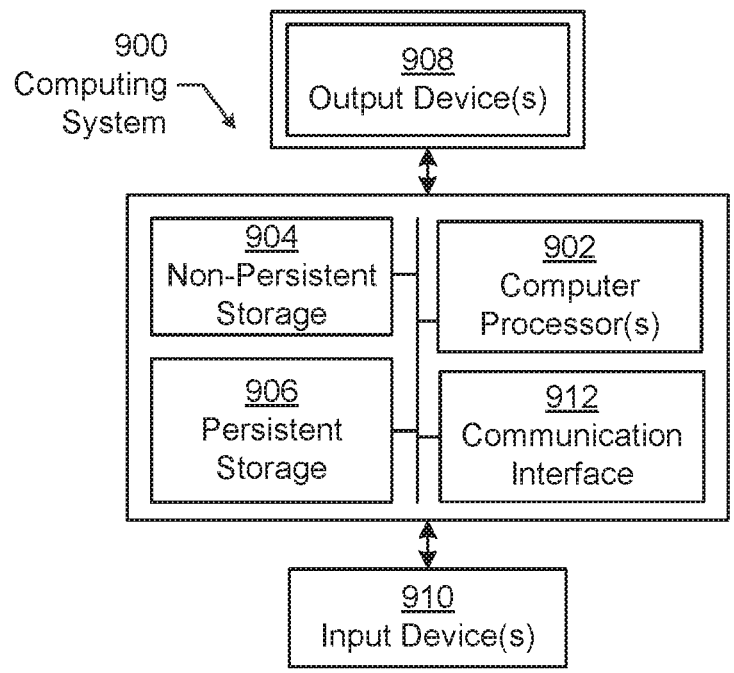
FIG. 9.1
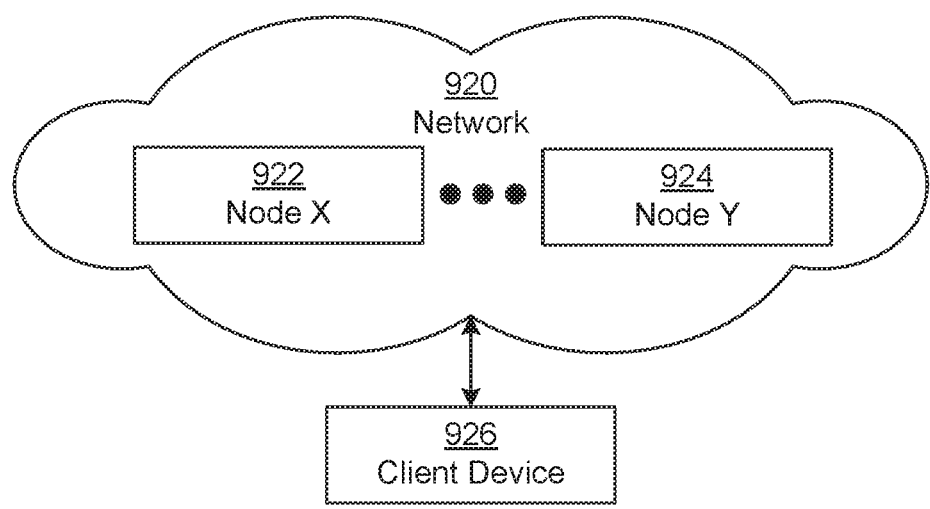
FIG. 9.2

HAPTIC FEEDBACK WIRE MOUNT

FIELD

This invention generally relates to electronic devices.

BACKGROUND

Input devices, including proximity sensor devices (also commonly called touchpads or touch sensor devices), are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

In general, in one aspect, the invention relates to an input device. The input device includes a wire element and a moveable substrate coupled to the wire element. The moveable substrate includes various wire alignment features. The input device further includes an input surface disposed above the moveable substrate. The input device further includes various sensor electrodes coupled to the input surface. The input device further includes a haptic actuator coupled to the moveable substrate. The haptic actuator displaces the moveable substrate in a direction substantially parallel to a plane of the input surface. The wire element returns the moveable substrate to an original position. The wire alignment features allow, in response to an applied force by the haptic actuator and to the moveable substrate, a displacement of the moveable substrate in the direction that is substantially parallel to the plane of the input surface.

In general, in one aspect, the invention relates to an electronic system. The electronic system includes a housing and an input device. The input device includes a wire element coupled to the housing. The input device further includes a moveable substrate coupled to the wire element. The moveable substrate includes various wire alignment features. The input device further includes an input surface disposed above the moveable substrate. The input device further includes various sensor electrodes coupled to the input surface. The input device further includes a haptic actuator coupled to the moveable substrate. The haptic actuator displaces the moveable substrate in a direction substantially parallel to a plane of the input surface. The wire element returns the moveable substrate to an original position. The wire alignment features allow, in response to an applied force by the haptic actuator and to the moveable substrate, a displacement of the moveable substrate in the direction that is substantially parallel to the plane of the input surface. The electronics system further includes a processing system communicatively coupled to the input device. The processing system determines, using the sensor electrodes, positional information of an input object in a sensing region or force information of an input force applied to the input surface. The processing further causes the haptic actuator to produce the displacement of the moveable substrate in the direction in response to the positional information or the force information.

Other aspects of the invention will be apparent from the following description and the appended claims.

BRIEF DESCRIPTION OF DRAWINGS

FIGS. 9.1 and 9.2 show a computing system in accordance with one or more embodiments.

DETAILED DESCRIPTION

Figure 1:
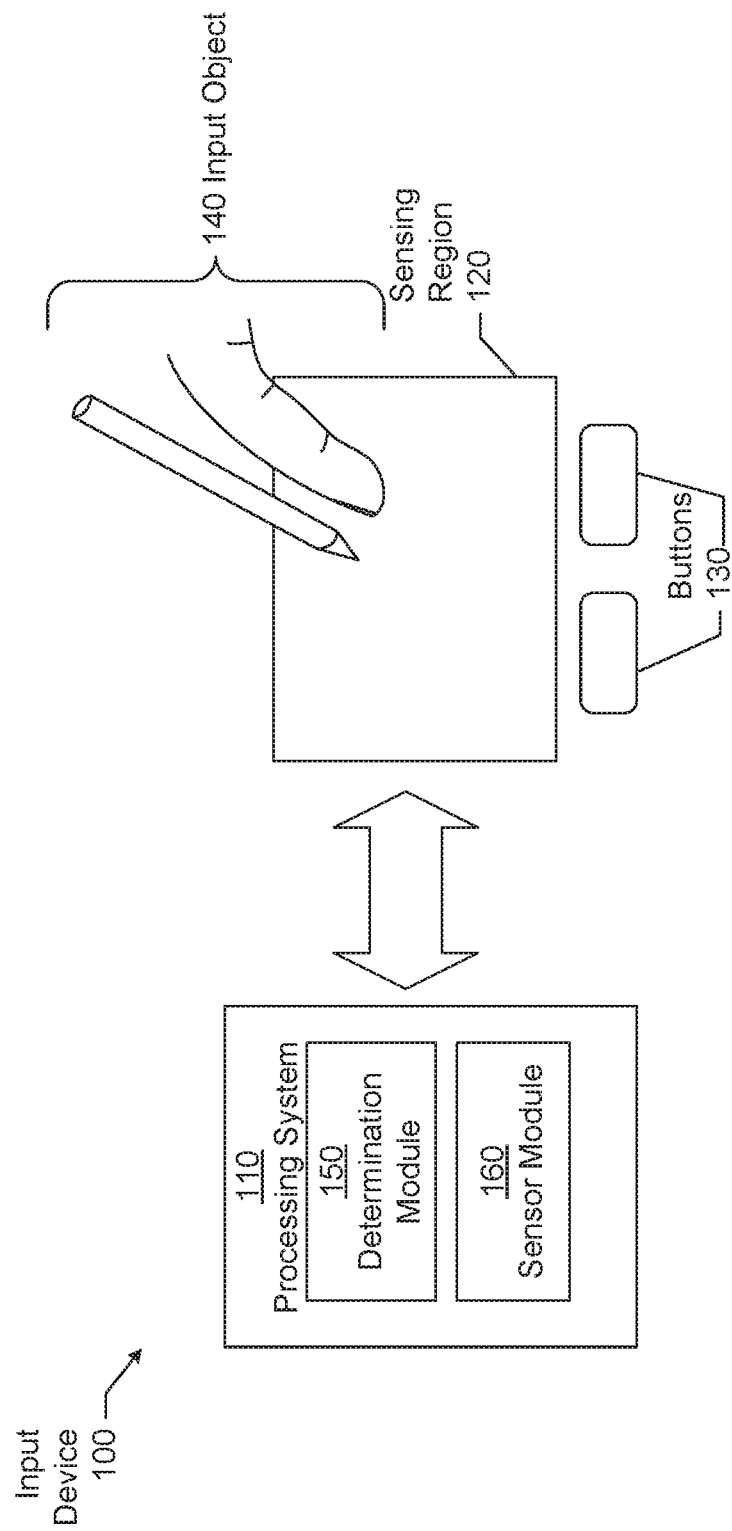
FIG. 1 shows a block diagram of an example system that includes an input device in accordance with an embodiment.

Specific embodiments of the invention will now be described in detail with reference to the accompanying figures. Like elements in the various figures may be denoted by like reference numerals and/or like names for consistency.

The following detailed description is merely exemplary in nature, and is not intended to limit the invention or the application and uses of the invention. Furthermore, there is no intention to be bound by any expressed or implied theory presented in the preceding technical field, background, brief summary or the following detailed description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments of the present invention provide input devices and methods that facilitate improved usability. In particular, one or more embodiments of the invention are directed to providing an input device with a moveable substrate coupled to a haptic actuator. In various embodiments, wire alignment features and wire capturing features may be coupled with various wire elements to support and control displacement of the moveable substrate. Specifically, the wire alignment features may prevent movement of the moveable substrate away from the axis of a desired haptic motion, while the wire capturing features may prevent movement outside the plane of the desired haptic motion. For example, where the desired haptic motion occurs along a y-axis parallel to an input surface of the input device, the wire alignment features may control displacement along an x-axis perpendicular to the y-axis. Likewise, the wire capturing features may limit movement of the moveable substrate along a z-axis perpendicular to a plane of the input surface. Specifically, in one or more embodiments, wire alignment features include physical tabs embedded in the moveable substrate, while the wire capturing features include hook-shaped structures.

Turning now to the figures, FIG. 1 is a block diagram of an exemplary input device (100), in accordance with embodiments of the invention. The input device (100) may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device (100) and separate joysticks or key switches. Further example electronic systems include peripherals, such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device (100) may be implemented as a physical part of the electronic system, or may be physically separate from the electronic system. Further, portions of the input device (100) may be part of the electronic system. For example, all or part of the determination module may be implemented in the device driver of the electronic system. As appropriate, the input device (100) may communicate with parts of the electronic system using any one or more of the following: buses, networks, and other wired or wireless interconnections. Examples include I2C, SPI, PS/2, Universal Serial Bus (USB), Bluetooth, RF, and IRDA.

In FIG. 1, the input device (100) is shown as a proximity sensor device (also often referred to as a "touchpad" or a "touch sensor device") configured to sense input provided by one or more input objects (140) in a sensing region (120). Example input objects include fingers and styli, as shown in FIG. 1. Throughout the specification, the singular form of input object may be used. Although the singular form is used, multiple input objects may exist in the sensing region (120). Further, the particular input objects in the sensing region may change over the course of one or more gestures. To avoid unnecessarily complicating the description, the singular form of input object is used and refers to all of the above variations.

The sensing region (120) encompasses any space above, around, in and/or near the input device (100) in which the input device (100) is able to detect user input (e.g., user input provided by one or more input objects (140)). The sizes, shapes, and locations of particular sensing regions may vary widely from embodiment to embodiment.

In some embodiments, the sensing region (120) extends from a surface of the input device (100) in one or more directions into space until signal-to-noise ratios prevent sufficiently accurate object detection. The extension above the surface of the input device may be referred to as the above surface sensing region. The distance to which this sensing region (120) extends in a particular direction, in various embodiments, may be on the order of less than a millimeter, millimeters, centimeters, or more, and may vary significantly with the type of sensing technology used and the accuracy desired. Thus, some embodiments sense input that includes no contact with any surfaces of the input device (100), contact with an input surface (e.g., a touch surface) of the input device (100), contact with an input surface of the input device (100) coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region (120) has a rectangular shape when projected onto an input surface of the input device (100).

The input device (100) may utilize any combination of sensor components and sensing technologies to detect user input in the sensing region (120). The input device (100) includes one or more sensing elements for detecting user input. As several non-limiting examples, the input device (100) may use capacitive, elastive, resistive, inductive, magnetic, acoustic, ultrasonic, and/or optical techniques.

Some implementations are configured to provide images that span one, two, three, or higher-dimensional spaces. Some implementations are configured to provide projections of input along particular axes or planes. Further, some implementations may be configured to provide a combination of one or more images and one or more projections.

In some resistive implementations of the input device (100), a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device (100), one or more sensing elements pick up loop currents induced by a resonating coil or pair of coils. Some combination of the magnitude, phase, and frequency of the currents may then be used to determine positional information.

In some capacitive implementations of the input device (100), voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects. The reference voltage may be a substantially constant voltage or a varying voltage and in various embodiments; the reference voltage may be system ground. Measurements acquired using absolute capacitance sensing methods may be referred to as absolute capacitive measurements.

Some capacitive implementations utilize "mutual capacitance" (or "trans capacitance") sensing methods based on changes in the capacitive coupling between sensor electrodes. In various embodiments, an input object near the sensor electrodes alters the electric field between the sensor electrodes, thus changing the measured capacitive coupling. In one implementation, a mutual capacitance sensing method operates by detecting the capacitive coupling between one or more transmitter sensor electrodes (also "transmitter electrodes" or "transmitter") and one or more receiver sensor electrodes (also "receiver electrodes" or "receiver"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. The reference voltage may be a substantially constant voltage and, in various embodiments, the reference voltage may be system ground. In some embodiments, transmitter sensor electrodes may be modulated. The transmitter electrodes are modulated relative to the receiver electrodes to transmit transmitter signals and to facilitate receipt of resulting signals. A resulting signal may include effect(s) corresponding to one or more transmitter signals, and/or to one or more sources of environmental interference (e.g., other electromagnetic signals). The effect(s) may be the transmitter signal, a change in the transmitter signal caused by one or more input objects and/or environmental interference, or other such effects. Sensor electrodes may be dedicated transmitters or receivers, or may be configured to both transmit and receive. Measurements acquired using mutual capacitance sensing methods may be referred to as mutual capacitance measurements.

Further, the sensor electrodes may be of varying shapes and/or sizes. The same shapes and/or sizes of sensor electrodes may or may not be in the same groups. For example, in some embodiments, receiver electrodes may be of the same shapes and/or sizes while, in other embodiments, receiver electrodes may be varying shapes and/or sizes.

In FIG. 1, a processing system (110) is shown as part of the input device (100). The processing system (110) is configured to operate the hardware of the input device (100) to detect input in the sensing region (120). The processing system (110) includes parts of, or all of, one or more integrated circuits (ICs) and/or other circuitry components. For example, a processing system for a mutual capacitance sensor device may include transmitter circuitry configured to transmit signals with transmitter sensor electrodes, and/or receiver circuitry configured to receive signals with receiver sensor electrodes. Further, a processing system for an absolute capacitance sensor device may include driver circuitry configured to drive absolute capacitance signals onto sensor electrodes, and/or receiver circuitry configured to receive signals with those sensor electrodes. In one or more embodiments, a processing system for a combined mutual and absolute capacitance sensor device may include any combination of the above described mutual and absolute capacitance circuitry. In some embodiments, the processing system (110) also includes electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens, driving haptic actuators/mechanisms (not shown), etc.

The processing system (110) may be implemented as a set of modules that handle different functions of the processing system (110). Each module may include circuitry that is a part of the processing system (110), firmware, software, and/or a combination thereof. In various embodiments, different combinations of modules may be used. For example, as shown in FIG. 1, the processing system (110) may include a determination module (not shown) and a sensor module (not shown). The determination module may include functionality to determine when at least one input object is in a sensing region, determine signal to noise ratio, determine positional information of an input object, identify a gesture, determine an action to perform based on the gesture, a combination of gestures or other information, and/or perform other operations.

The sensor module may include functionality to drive the sensing elements to transmit transmitter signals and receive the resulting signals. For example, the sensor module may include sensory circuitry that is coupled to the sensing elements. The sensor module may include, for example, a transmitter module and a receiver module. The transmitter module may include transmitter circuitry that is coupled to a transmitting portion of the sensing elements. The receiver module may include receiver circuitry coupled to a receiving portion of the sensing elements and may include functionality to receive the resulting signals.

Alternative or additional modules may exist in accordance with one or more embodiments. Such alternative or additional modules may correspond to distinct modules or submodules of one or more of the modules discussed above. Example alternative or additional modules include hardware operation modules for operating hardware such as sensor electrodes and display screens, data processing modules for processing data such as sensor signals and positional information, reporting modules for reporting information, and identification modules configured to identify gestures, such as mode changing gestures, and mode changing modules for changing operation modes. Further, the various modules may be combined in separate integrated circuits. For example, a first module may be comprised at least partially within a first integrated circuit and a separate module may be comprised at least partially within a second integrated circuit. Further, portions of a single module may span multiple integrated circuits. In some embodiments, the processing system as a whole may perform the operations of the various modules.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, haptic actuation, and other functions. In some embodiments, the processing system (110) provides information about the input (or lack of input) to some part of the electronic system (e.g., to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

For example, in some embodiments, the processing system (110) operates the sensing element(s) of the input device (100) to produce electrical signals indicative of input (or lack of input) in the sensing region (120). The processing system (110) may perform any appropriate amount of processing on the electrical signals in producing the information provided to the electronic system. For example, the processing system (110) may digitize analog electrical signals obtained from the sensor electrodes. As another example, the processing system (110) may perform filtering or other signal conditioning. As yet another example, the processing system (110) may subtract or otherwise account for a baseline, such that the information reflects a difference between the electrical signals and the baseline. As yet further examples, the processing system (110) may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

"Force information" as used herein is intended to broadly encompass force information regardless of format. For example, the force information may be provided for each object as a vector or scalar quantity. As another example, the force information may be provided as an indication that determined force has or has not crossed a threshold amount. As other examples, the force information can also include time history components used for gesture recognition. As will be described in greater detail below, positional information and force information from the processing systems may be used to facilitate a full range of interface inputs, including use of the proximity sensor device as a pointing device for selection, cursor control, scrolling, and other functions.

In some embodiments, the input device (100) is implemented with additional input components that are operated by the processing system (110) or by some other processing system. These additional input components may provide redundant functionality for input in the sensing region (120), or some other functionality. FIG. 1 shows buttons (130) near the sensing region (120) that may be used to facilitate selection of items using the input device (100). Other types of additional input components include sliders, balls, wheels, switches, and the like. Conversely, in some embodiments, the input device (100) may be implemented with no other input components.

In some embodiments, the input device (100) includes a touch screen interface, and the sensing region (120) overlaps at least part of an active area of a display screen. For example, the input device (100) may include substantially transparent sensor electrodes overlaying the display screen and provide a touch screen interface for the associated electronic system. The display screen may be any type of dynamic display capable of displaying a visual interface to a user, and may include any type of light-emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. In various embodiments, one or more display electrodes of a display device may be configured for both display updating and input sensing. As another example, the display screen may be operated in part or in total by the processing system (110).

It should be understood that while many embodiments are described in the context of a fully-functioning apparatus, the mechanisms of the various embodiments are capable of being distributed as a program product (e.g., software) in a variety of forms. For example, the mechanisms of various embodiments may be implemented and distributed as a software program on information-bearing media that are readable by electronic processors (e.g., non-transitory computer-readable and/or recordable/writable information bearing media that is readable by the processing system (110)). Additionally, the embodiments may apply equally regardless of the particular type of medium used to carry out the distribution. For example, software instructions in the form of computer readable program code to perform one or more embodiments may be stored, in whole or in part, temporarily or permanently, on a non-transitory computer-readable storage medium. Examples of non-transitory, electronically-readable media include various discs, physical memory, memory, memory sticks, memory cards, memory modules, and or any other computer readable storage medium. Electronically-readable media may be based on flash, optical, magnetic, holographic, or any other storage technology.

Although not shown in FIG. 1, the processing system, the input device, and/or the host system may include one or more computer processor(s), associated memory (e.g., random access memory (RAM), cache memory, flash memory, etc.), one or more storage device(s) (e.g., a hard disk, an optical drive such as a compact disk (CD) drive or digital versatile disk (DVD) drive, a flash memory stick, etc.), and numerous other elements and functionalities. The computer processor(s) may be an integrated circuit for processing instructions. For example, the computer processor(s) may be one or more cores or micro-cores of a processor. Further, one or more elements of one or more embodiments may be located at a remote location and connected to the other elements over a network. Further, embodiments may be implemented on a distributed system having several nodes, where each portion an embodiment may be located on a different node within the distributed system. In one or more embodiments, the node corresponds to a distinct computing device. Alternatively, the node may correspond to a computer processor with associated physical memory. The node may alternatively correspond to a computer processor or micro-core of a computer processor with shared memory and/or resources.

While FIG. 1 shows a configuration of components, other configurations may be used without departing from the scope of the invention. For example, various components may be combined to create a single component. As another example, the functionality performed by a single component may be performed by two or more components. Accordingly, for at least the above-recited reasons, embodiments of the invention should not be considered limited to the specific arrangements of components and/or elements shown in FIG. 1.

Figure 2:
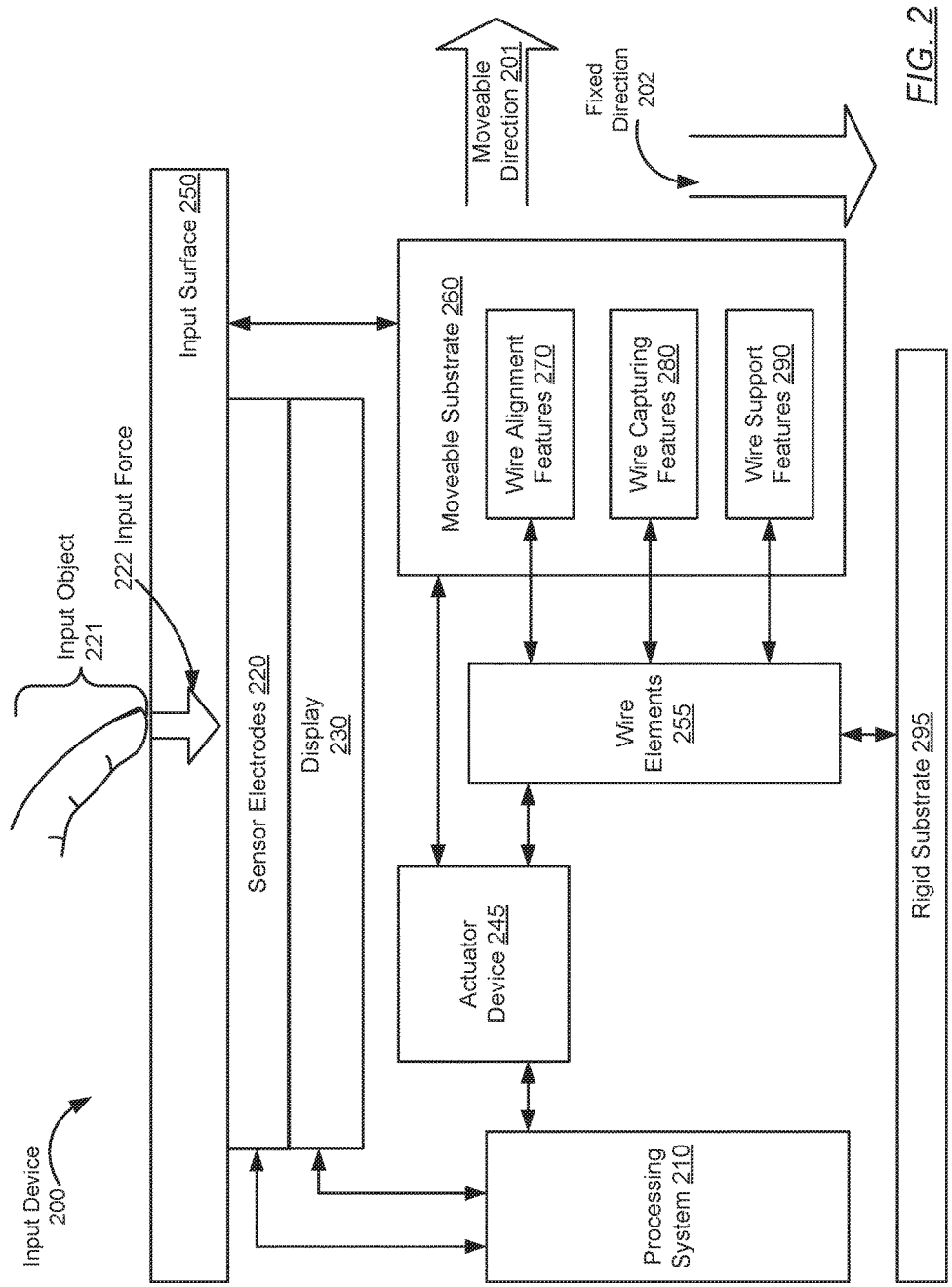
FIG. 2 shows a schematic view of an example input device in accordance with one or more embodiments.

FIG. 2 shows a schematic view of an input device (200) in accordance with one or more embodiments. As shown in FIG. 2, the input device (200) may include an input surface (250), various sensor electrodes (220), a display (230), and a rigid substrate (295). The rigid substrate (295) may be similar to the rigid support substrate (602) or the housing (601) described below in FIG. 6 and the accompanying description. The sensor electrodes (220) may be configured to determine positional and/or force information from one or more input objects in a sensing region. For example, an input object (221) may apply an input force (222) to the input surface (250). The sensor electrodes (220) may determine force information with respect to the input force (222) and/or the location of the input object (221) in a sensing region above the input surface (250). While the sensor electrodes (220) are shown disposed directly underneath the input surface (250), the sensor electrodes (220) may be disposed at various locations throughout the input device (200) and/or in various layers of the input device (200) not shown.

In one or more embodiments, the input device (200) includes a moveable substrate (260). The moveable substrate (260) may be a physical mass that displaces in one or more predetermined directions in response to an actuator force. In one or more embodiments, for example, the moveable substrate (260) may be a substantially-planar mass such as a rectangular plate. In other embodiments, the moveable substrate (260) may be curved and/or angular at one or more regions of the moveable substrate (260). The moveable substrate (260) may be composed of a single uniform material or a variety of different materials. For example, the moveable substrate (260) may be composed of rigid and/or non-rigid materials, such as various metals, plastics, fiberglass, rubber, etc.

In one or more embodiments, the input device (200) includes one or more wire elements (255) that include functionality to support the moveable substrate (260) in the input device (200). Specifically, the wire elements (255) may act as a spring mechanism. In response to an actuator force (not shown) applied to the moveable substrate (260), the wire elements (255) may elastically bend or flex, and thereby displace the moveable substrate (260) along a moveable direction (201). The moveable direction (201) may be a direction that a haptic event or desired motion occurs with respect to the moveable substrate (260). For more information on haptic events, see FIG. 8 and the accompanying description below.

After the force is released, one or more of the wire elements (255) may release the potential energy within the wire elements (255) to restore the moveable substrate (260) to an original position within the input device (200). In particular, the wire elements (255) may be, for example, metal wires, elastic cables, and/or other spring-like wire components. Likewise, the wire elements (255) may be a single wire or several wires of different lengths and material types. For example, the wire elements (255) may compose a mounting wire made from steel, nickel, and any other materials capable of implementing a spring mechanism. In one or more embodiments, for example, the moveable substrate (260) is a plastic material, and the wire elements (255) are insert molded into the moveable substrate (260). Furthermore, the wire elements (255) may be fixed to a rigid substrate (295) as a supporting structure for a spring mechanism. For example, the rigid substrate (295) may be a chassis or a housing of an electronic system.

Figure 3:
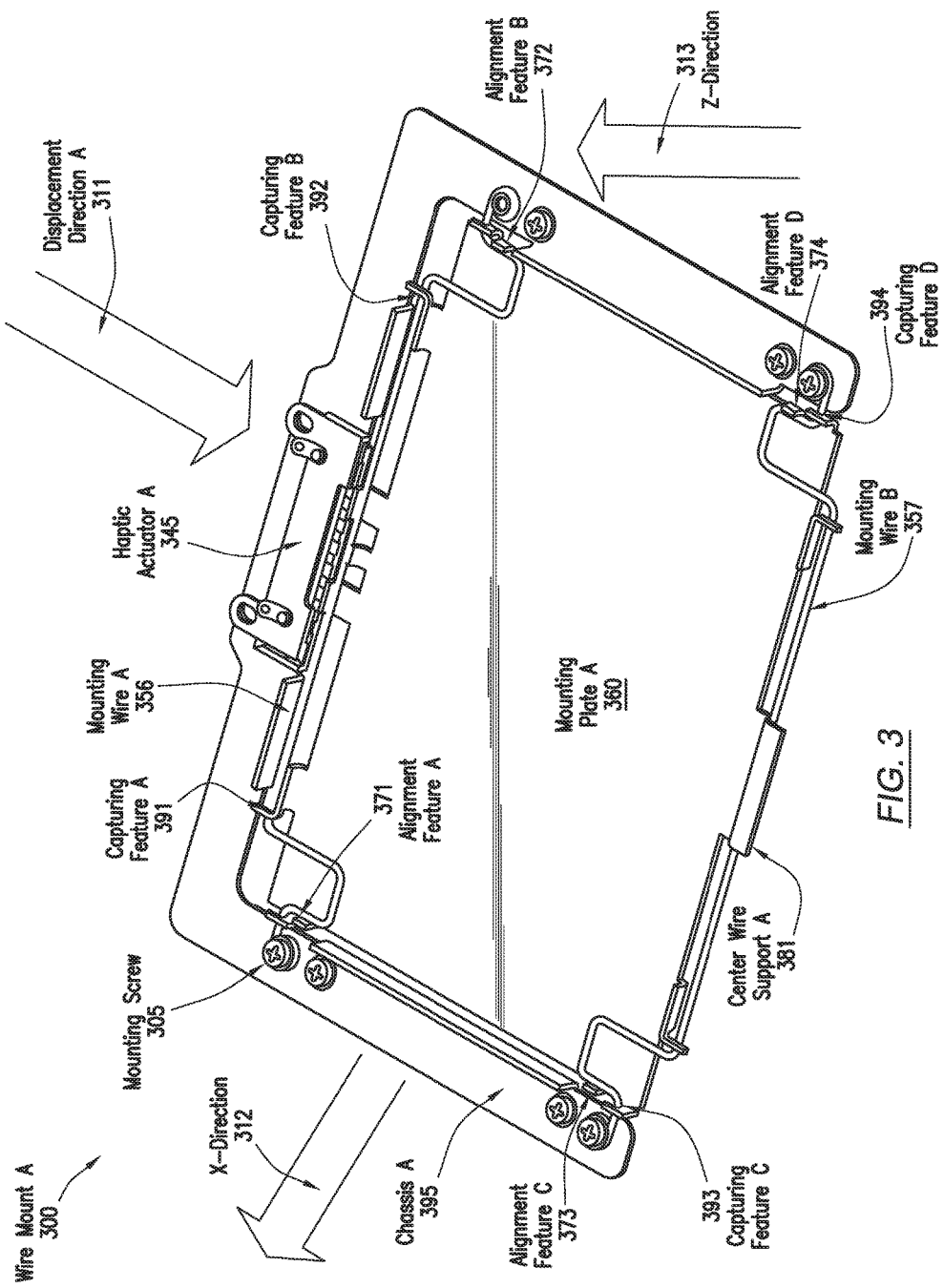
FIG. 3 shows a perspective view of a bottom portion of an example input device in accordance with one or more embodiments.
Figure 4:
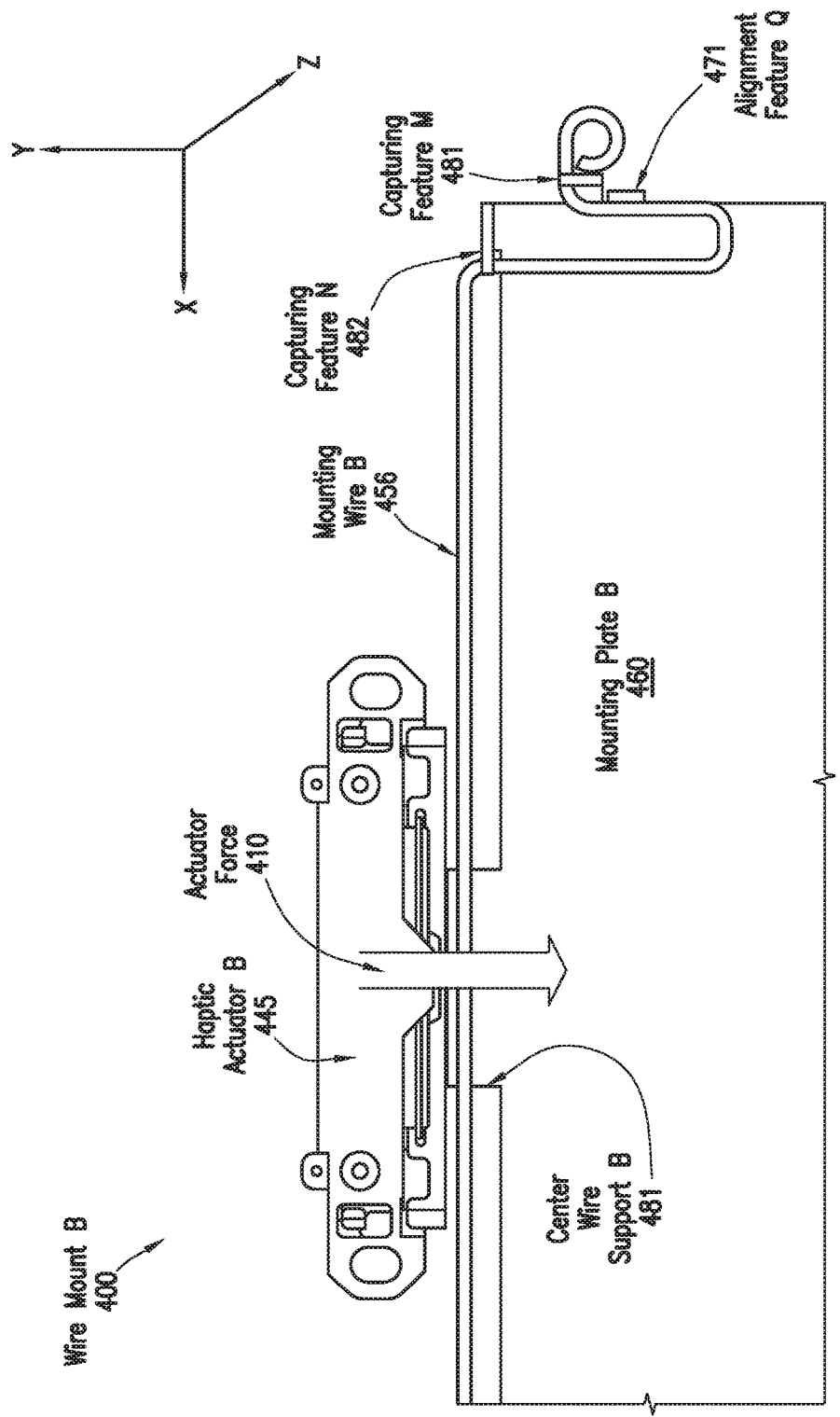
FIG. 4 shows a perspective view of a portion of an example wire mount in accordance with one or more embodiments.
Figure 5:
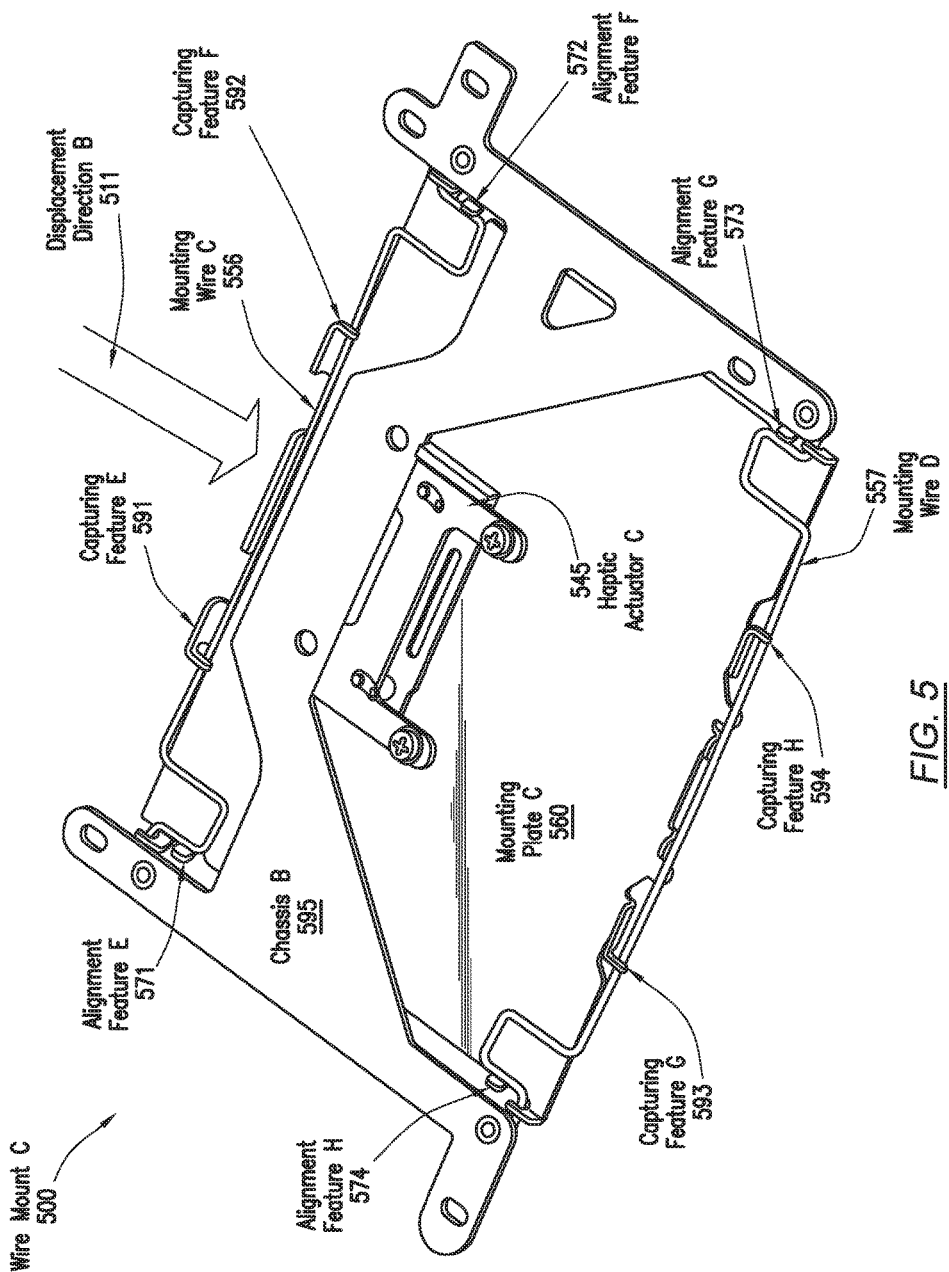
FIG. 5 shows a perspective view of a bottom portion of an example input device in accordance with one or more embodiments.

In one or more embodiments, the input device (200) includes various wire alignment features (270) that couple to the wire elements (255). In one or more embodiments, the wire alignment features (270) are physical components that are part of the moveable substrate (260) and/or separate components from the moveable substrate (260). In one or more embodiments, for example, the wire alignment features (270) include physical tabs that protrude from the moveable substrate (260). The physical tabs may be located proximate one or more edges of a mounting plate as shown in FIGS. 3, 4, and 5. For example, one physical tab may be located on an edge of a mounting plate and another physical tab may be located remotely on the opposite edge of the mounting plate. In another embodiment, the wire alignment features (270) include attachable hardware components that may be fixed to the moveable substrate (260).

In one or more embodiments, the wire alignment features (270) include functionality to allow a displacement of the moveable substrate (260) in the moveable direction (201) and prevent displacement of the moveable substrate (260) in a fixed direction (202). Moreover, in the input device (200), a wire element may be disposed along a surface of a wire alignment feature that is substantially parallel with the moveable direction (201). As such, a wire alignment feature may provide a buffer against a wire element shifting along the fixed direction (202) while providing movement of the wire element along the moveable direction (201).

While the moveable direction (201) is shown perpendicular to the fixed direction (202) in FIG. 2, various embodiments are contemplated. In one or more embodiments, for example, the moveable direction (201) is the y-axis of the input device (200), and the fixed direction (202) is the x-axis of the input device (200). On the other hand, the fixed direction (202) may be a predetermined direction that is not substantially perpendicular to the moveable direction (201). For example, the fixed direction (202) may be designated to prevent damage and/or wear to one or more internal components of the input device (200). Moreover, in one or more embodiments, the moveable direction (201) corresponds to a direction of a specific type of haptic feedback produced with the input device (200). As such, the fixed direction (202) may be a predetermined direction that increases performance of the haptic feedback. While one fixed direction is shown in FIG. 2, in one or more embodiments, two or more fixed directions exist in an input device with respect to a moveable substrate.

In one or more embodiments, the input device (200) includes various wire capturing features (280) that couple to the wire elements (255). The wire capturing features (280) may be physical components that are part of the moveable substrate (260) and/or separate components from the moveable substrate (260). The wire capturing features (280) may be hardware components similar to the wire alignment features (270) that provide a buffer against the wire elements (255) moving in a different direction from the fixed direction (202) of the moveable substrate (260). In one or more embodiments, for example, a wire capturing feature may include functionality to hold a wire element in place at a specific location while producing substantially no friction during the displacement of the moveable substrate (260).

In one or more embodiments, the wire capturing features (280) include functionality to prevent at least a portion of a displacement of the moveable substrate (260) into and/or facing away from the input surface (250). Specifically, the wire capturing features (280) may prevent displacement in a direction substantially perpendicular to a plane of the input surface (250). In one or more embodiments, one or more of the wire capturing features (280) are hook-shaped structures. For example, a hook-shaped structure may include a protrusion perpendicular to a wire element that makes contact with the hook-shaped structure. Likewise, the protrusion may prevent the contacting wire element from moving in the z-direction of the input device (200). Thus, the wire capturing feature may also produce a mechanical connection, e.g., using friction or having a wire element wrapped around the wire capturing feature, between the wire element and the moveable substrate (260).

The input device (200) may further include various wire support features (290) that couple to the wire elements (255). Similar to the wire alignment features (270) and/or the wire capturing features (280), the wire support features (290) may be physical components that are part or separate from the moveable substrate (260). In one or more embodiments, the wire support features (290) provide non-moving contact surfaces between the moveable substrate (260) and the wire elements (255). For example, the wire support features (290) may hold certain segments of the wire elements (255) in place. Likewise, the wire support features (290) may induce an amount of pre-load force, such as tension, at one or more locations. The wire support features (290) may include functionality to produce specific restoring forces in response to an actuation force from an actuator device (245) and/or distribute the actuation force at different locations on the moveable substrate (260).

In one or more embodiments, the input device (200) includes an actuator device (245) coupled to a processing system (210), the wire elements (255), and/or the moveable substrate (260). The processing system (210) may be similar to the processing system (110) described in FIG. 1 and the accompanying description. In one or more embodiments, the actuator device (245) includes functionality to generate an actuation force that displaces the moveable substrate (260) in the moveable direction (201). For example, the displacement may produce a haptic event experienced by a user of the input device (200). The actuation force may be applied directly to the moveable substrate (260) and/or to one or more of the wire elements (255) to move the moveable substrate from the original position in the input device (200) to one or more locations within the input device (200), thereby generating the haptic event.

Various types of actuators are contemplated with the actuator device (245). In one or more embodiments, for example, the actuator device (245) is a shape memory alloy. As such, the actuation force may be caused by the application of current to a shape memory alloy inside the actuator device (245). Thus, the application of current to the shape memory alloy may cause the temperature of the shape memory alloy to rise, leading to a contraction of the shape memory alloy. The rise in temperature and corresponding contraction of the shape memory alloy may cause the haptic actuation. However, other actuators may be used in addition to or in place of a shape memory alloy haptic actuator, such as actuator devices that include electromagnetic elements, electric motors, piezoelectrical transducers, and actuator devices that implement various other electromechanical and/or piezoelectrical technologies capable of generating force and displacement.

Turning to FIGS. 3, 4, and 5, FIGS. 3, 4, and 5 provide examples of wire mounts for input devices. The following examples are for explanatory purposes only and not intended to limit the scope of the invention.

In FIG. 3, a wire mount A (300) is shown for an input device. Specifically, the wire mount A (300) includes a mounting plate A (360), a haptic actuator A (345) and various wire elements (e.g., a mounting wire A (356) and a mounting wire B (357)) coupling the mounting plate A (360) to a chassis A (395) using various coupling elements (e.g., mounting screw (305)). While an input surface of an input device is not shown in FIG. 3, the input surface may be located on the opposite side of the mounting plate A (360) as shown from the perspective view in FIG. 3.

Keeping with FIG. 3, the mounting plate A (360) is a moveable substrate and the haptic actuator A (345) is an actuator device that applies an actuator force to displace the mounting plate A (360) in displacement direction A (311). As such, the displacement direction A (311) is a moveable direction for the wire mount A (300). Accordingly, as the mounting plate A (360) moves in the displacement direction A (311), tension is produced in the mounting wire A (356) and mounting wire B (357). When the actuator force of the haptic actuator A (345) terminates, mounting wire A (356) and mounting wire B (357) produce restoring forces that move the mounting plate A (360) to the mounting plate's original position within the wire mount A (300).

Furthermore, the wire mount A (300) also includes various wire alignment features (e.g., alignment feature A (371), alignment feature B (372), alignment feature C (373), and alignment feature D (374)). Specifically, during displacement of the mounting plate A (360), the alignment features (371, 372, 373, 374) prevent the mounting wires (356, 357) from moving along the x-direction A (312). Likewise, the wire mount A (300) also includes various wire capturing features (e.g., capturing feature A (391), capturing feature B (392), capturing feature C (393), and capturing feature D (394)), which may prevent displacement of the mounting plate A (360) in the z-direction (313). In FIG. 3, the z-direction (313) represents a direction into or out of the mounting plate A (360). In the wire mount A (300), both the x-direction (312) and the z-direction (313) are fixed directions as discussed in FIG. 2 and the accompanying description. As shown, the wire mount A (300) also includes various wire support features (e.g., center wire support A (381)).

Turning to FIG. 4, FIG. 4 shows a portion of a wire mount B (400) for an input device. Specifically, the wire mount B (400) includes a mounting plate B (460), a haptic actuator B (445), and a mounting wire B (456). In FIG. 4, alignment feature Q (471) prevents movement of the mounting wire B (456) along the x-axis. Likewise, capturing feature M (481) prevents movement of the mounting wire B (456) along the z-axis. As shown, capturing feature N (482) is a hook-shaped structure that prevents movement of the mounting wire B (456) in both the z-axis and the x-axis. Accordingly, capturing feature N (482) may be treated as either a wire alignment feature or a wire capturing feature. Therefore, when the haptic actuator B (445) produces actuator force (410) on a center wire support B (481) of the mounting plate B (460), the mounting plate B (460) may displace in the y-axis with approximately no displacement in the x-axis and/or z-axis. Moreover, applying the actuator force directly to a moveable substrate, such as the mounting plate B (460), may reduce the loss of output of the actuator force due to flexing, friction, etc.

Turning to FIG. 5, a wire mount C (500) for an input device is shown. Specifically, the wire mount C (500) includes a mounting plate C (560), a haptic actuator C (545) and various wire elements (e.g., a mounting wire C (556) and a mounting wire D (557)) coupling the mounting plate C (560) to a chassis B (595) using various coupling elements. Similar to wire mount A (300), an input surface (not shown) may be located on the opposite side of the mounting plate C (560) as shown from the perspective view in FIG. 5. Thus, the haptic actuator C (545) may be disposed on the side of the mounting plate C (560) facing away from the input surface.

In another embodiment, for example, a mounting wire may be coupled directly to an input device housing instead of a chassis. Likewise, a haptic actuator may exert an actuator force on the input device housing instead of the chassis.

Keeping with FIG. 5, the haptic actuator C (545) is coupled to a central region of the mounting plate C (560). Specifically, the haptic actuator C (545) may apply an actuator force to the chassis B (595) to produce a displacement of the mounting plate C (560) in the displacement direction B (511). The wire mount C (500) is similar to the wire mounts shown in FIGS. 3 and 4, but an actuator force is applied to a rigid support substrate instead of directly to a moveable substrate. Accordingly, as the mounting plate C (560) moves in the displacement direction B (511), tension is produced in the mounting wire C (556) and mounting wire D (557). Furthermore, the wire mount C (500) further includes various wire alignment features (e.g., alignment feature E (571), alignment feature F (572), alignment feature G (573), and alignment feature H (574)). The wire mount C (500) also includes various wire capturing features (e.g., capturing feature E (591), capturing feature F (592), capturing feature G (593), and capturing feature H (594)).

Figure 6:
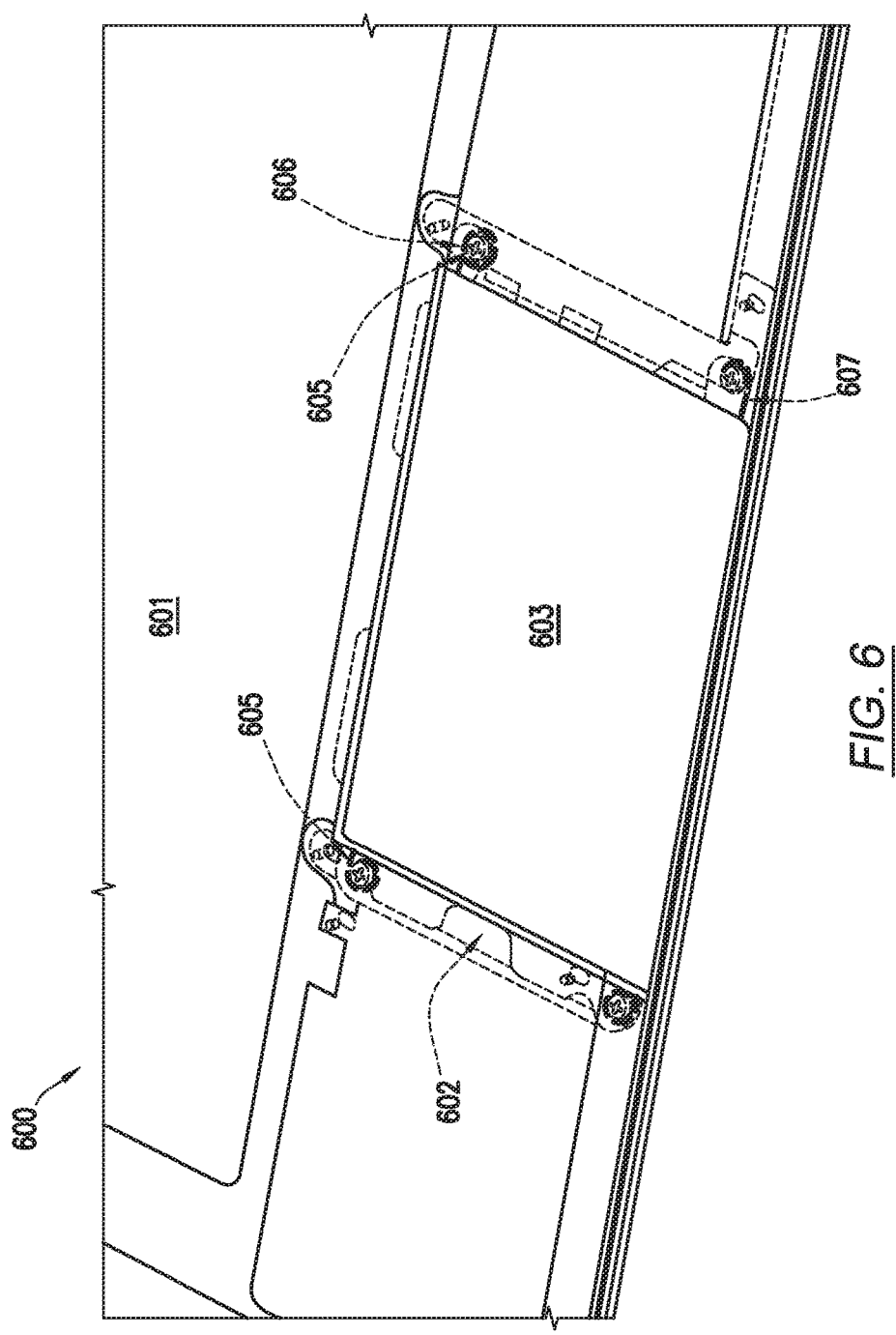
FIG. 6 shows a perspective view of an example input device in accordance with one or more embodiments.

Turning to FIG. 6, FIG. 6 shows a perspective view of an example input device (600) in accordance with one or more embodiments. In one or more embodiments, the input device (600) is configured to determine positional and/or force information from one or more input objects in a sensing region. In the exemplary embodiment of an input device shown in FIG. 6, the input device (600) includes a housing (601), a rigid support substrate (602), a first wire element (606), a second wire element (607), a moveable substrate (not shown), and an input surface (603). In one or more embodiments, the input surface (603) may be a sensing region. In one or more embodiments, the sensing region may be proximate to one or more sensing electrodes for determining positional information. Additionally or alternatively, the sensing region may be coupled to a force sensor, and the force sensor may be used to determine positional information and/or force information for one or more input objects on the input surface (603). In one or more embodiments, the force sensor includes one or more sensor electrodes and determines force applied by the input objects (e.g., the input objects (140) shown in FIG. 1) on the input surface (603).

In one or more embodiments, the input surface (603) may be disposed above the moveable substrate, and the moveable substrate may be mechanically coupled to the rigid support substrate (602) using the first wire element (606) and the second wire element (607). Further, in one or more embodiments, one or more coupling elements (605) may be disposed through the openings of the rigid support substrate (602) and may be disposed between the housing (601) and the rigid support substrate (602). In other words, in one or more embodiments, the coupling elements (605) may be used to mechanically couple the first wire (606) and the second wire element (607) to the rigid support substrate (602). In one or more embodiments, each of the coupling elements (605) may be configured to allow the moveable substrate to displace in activation moveable direction relative to the housing (601). As an example, the moveable direction may be on a plane of the input surface (603).

Further, in one or more embodiments, the input device (600) includes a haptic actuator (e.g., haptic actuator C (545)). In one or more embodiments, the haptic actuator may actuate in response to a position and/or force of an input object. In one or more embodiments, the haptic actuator may be coupled to the rigid support substrate (602) or the moveable substrate, and actuation of the haptic actuator may result in an actuator force being applied to the moveable substrate by the haptic actuator, (e.g., in the moveable direction). As shown, in one or more embodiments, the coupling elements (605) may be positioned near corner portions and/or edge portions of the rigid support substrate (602), and openings may be formed in such portions of the rigid support substrate (602), accordingly.

In one or more embodiments, the electronic system also includes a processing system (e.g., the processing system (110) of FIG. 1) configured to determine positional information and/or force information for one or more input objects (e.g., the input objects (140) of FIG. 1) and to actuate the haptic actuator to translate the moveable substrate in the moveable direction.

While FIG. 6 shows a configuration of components, other configurations may be used without departing from the scope of the invention. For example, various components may be combined to create a single component. As another example, the functionality performed by a single component may be performed by two or more components. Accordingly, for at least the above-recited reasons, embodiments of the invention should not be considered limited to the specific arrangements of components and/or elements shown in FIG. 6.

Figure 7:
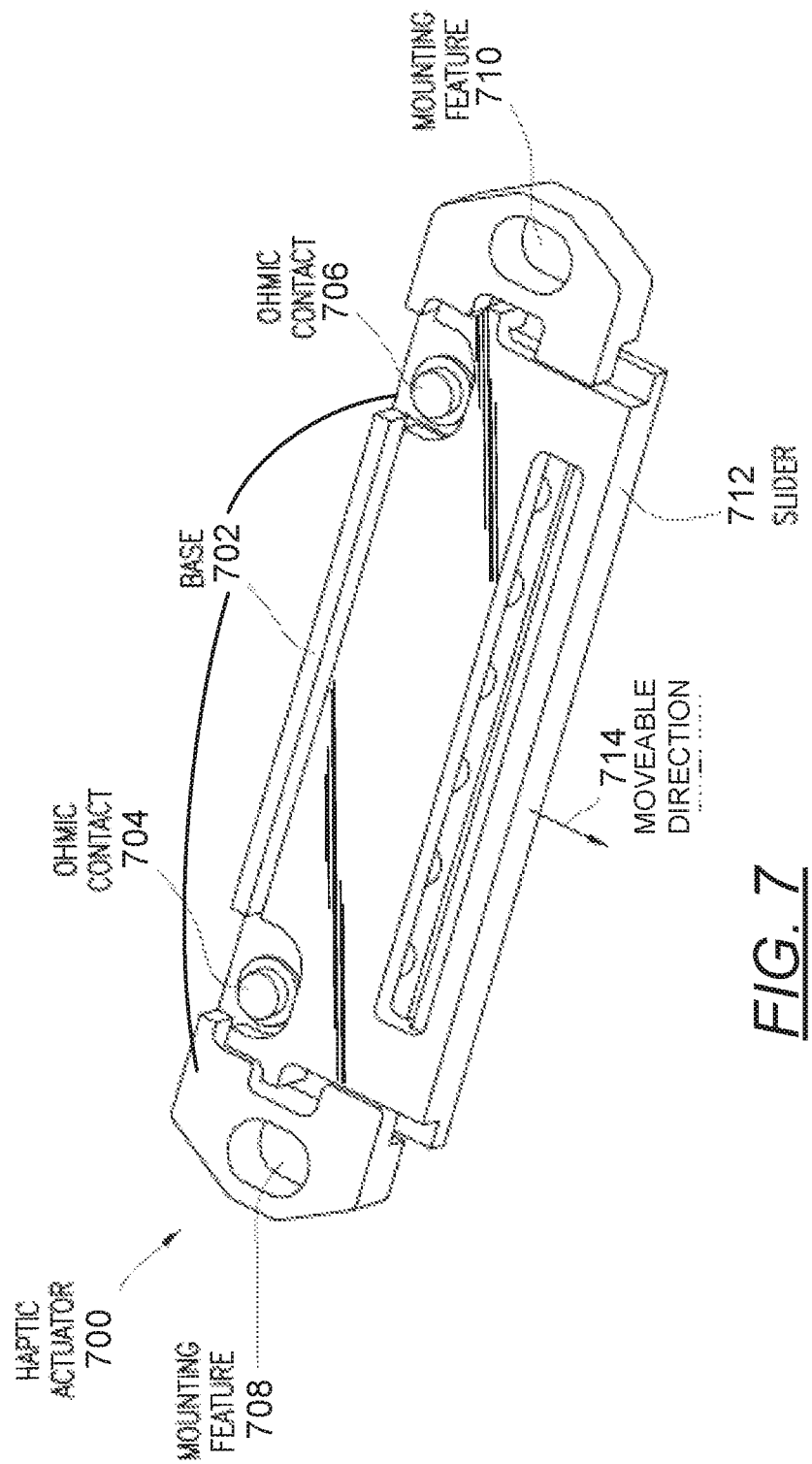
FIG. 7 shows a bottom view of a haptic actuator in accordance with one or more embodiments.

Turning to FIG. 7, FIG. 7 shows a bottom view of a haptic actuator in accordance with one or more embodiments of the invention. As shown in FIG. 7, the haptic actuator (700) includes a base (702), one or more mounting features (708 and 710), one or more ohmic contacts (704 and 706), and a slider (712). Each of these components is described below.

In one or more embodiments, the haptic actuator (700) is substantially similar to haptic actuator A (345) shown in FIG. 3, as described above. In one or more embodiments, haptic actuator (700) includes a base (702). In one or more embodiments, the base (702) may be formed from any rigid material (e.g., a metal such as aluminum). Additionally, the base (702) may be coated (e.g., anodized) such that the base (702) is not electrically conductive, but is thermally conductive. For example, a base made from aluminum may be thermally conductive, but may have a surface that is not electrically conductive once the aluminum base is anodized. In one or more embodiments, the thermal conductivity of the base (702) provides for heat dissipation from the haptic actuator (700). For example, the thermal conductivity of the base may provide for heat dissipation from the shape memory alloy. In the embodiment shown in FIG. 7, the base (702) has a length that is longer than the width, and a thickness that is less than either the length or width. In such embodiments, the relatively small thickness contributes to a haptic actuator (700) having a low profile. For example, the total thickness may be between two millimeters and three millimeters. One having ordinary skill in the art and the benefit of this Detailed Description will appreciate that the shape, length, and/or width of the haptic actuator (700) may vary between embodiments.

In one or more embodiments, the base (702) includes one or more mounting features (e.g., 708 and 710). The one or more mounting features (708 and 710) may be any shape and/or any location in or on the base (702) that allows the haptic actuator (700) to be mounted on to or assembled as part of a device (e.g., input device (600) of FIG. 6) or any other component. In the embodiment shown in FIG. 7, one mounting feature (708 and 710) is located at each end of the length of the base (702) and each mounting feature has a generally oval shape that extends through the base (702). The mounting features (708 and 710) may be used, for example, by inserting screws (not shown) or other attaching elements (not shown) through the mounting features (708 and 710) to affix the haptic actuator (700) to a device.

In one or more embodiments, the base may include one or more holes (not shown) for mounting one or more ohmic contacts (704 and 706). An ohmic contact (704 and 706) may be any contact surface that is electrically conductive (i.e., through which current may pass). As an example, the ohmic contacts (704 and 706) may be constructed, at least in part, of a metal such as copper. In one or more embodiments, the ohmic contacts (704 and 706) are affixed (e.g., glued) to the base (702) such that the ohmic contacts (704 and 706) pose less risk of accidentally scratching the base (702), which may affect the electrical isolation of the base (702). In one or more embodiments, the ohmic contacts (704 and 706) are disposed within cavities (not shown) of the base (702), which may or may not extend through the entire base. Disposition within the cavities may allow the ohmic contacts (704 and 706) to be affixed to the base (702), and to a shape memory alloy.

In one or more embodiments, for example, the haptic actuator (700) includes a slider (712). Similar to the base (702), in one or more embodiments, the slider (712) is formed from any rigid material (e.g., a metal such as aluminum). Additionally, the slider (712) may be coated (e.g., anodized) such that the slider (712) is not electrically conductive, but is thermally conductive. For example, a slider made from aluminum may be thermally conductive, but may have a surface that is not electrically conductive once the aluminum slider is anodized. In one or more embodiments, the thermal conductivity of the slider (712) provides for additional heat dissipation from the haptic actuator (700). For example, the thermal conductivity of the slider may provide for additional heat dissipation from the shape memory alloy. In one or more embodiments, the slider (712) is constructed from the same material as the base (702). In other embodiments, the slider (712) is constructed from a different material than the base (702).

In one or more embodiments, the slider (712) is disposed as at least a partial sheath that covers at least a portion of the base (702). Such a coupling may allow the base (702) and the slider (712) to have engagement surfaces in which a shape memory alloy may be disposed. Disposition of the shape memory alloy between an engagement surface of the base (702) and an engagement surface of the slider (712) may reduce the chance of unwanted translation of the shape memory alloy relative to the haptic actuator. For example, in embodiments such as that shown in FIG. 3, the shape memory alloy (not shown) may be within the sheath of the slider (712), and therefore may be less likely to translate away from the haptic actuator (700).

The base (702) and slider (712) of the haptic actuator may be coupled such that the base and the slider are interlocked, but allow for translation of the slider (712) relative to the base (702) in at least one direction. For example, FIG. 7 shows an embodiment in which the base (702) and the slider (712) are interlocked such that the slider may translate relative to the base in the moveable direction (714).

While FIG. 7 shows a configuration of components of a haptic actuator, other configurations may be used without departing from the scope of the invention. For example, various components may be combined to create a single component. As another example, the functionality performed by a single component may be performed by two or more components. Additionally, in one or more embodiments, the haptic actuator (700) may include components and/or elements disposed in different locations relative to one another than are shown in FIG. 7. For example, the slider and the base may be interlocked in a manner that allows for movement in a direction other than the moveable direction shown in FIG. 7. As another example, the ohmic contacts may be located at a different location on the base, or on the slider. As another example, in one or more embodiments, the base (702) may be formed as an integral part of the rigid support substrate (602). For example, the rigid support substrate (602) may be machined and/or formed to include the features of the base (702) of the haptic actuator. In such embodiments, the cost of manufacturing and/or assembly of the input device (600) may be reduced. Accordingly, for at least the above-recited reasons, embodiments of the invention should not be considered limited to the specific arrangements of components and/or elements shown in FIG. 7.

While FIG. 7 describes a shape memory alloy haptic actuator, other types of actuator devices may be used in connection with the embodiments described in FIGS. 1-6 and the accompanying description. In particular, any actuator device may be used that includes functionality to apply an actuator force that produces a physical translation of a moveable substrate in at least one direction. Likewise, various actuator devices may be used that can be mounted directly or indirectly to a rigid support substrate and/or a moveable substrate.

Figure 8:
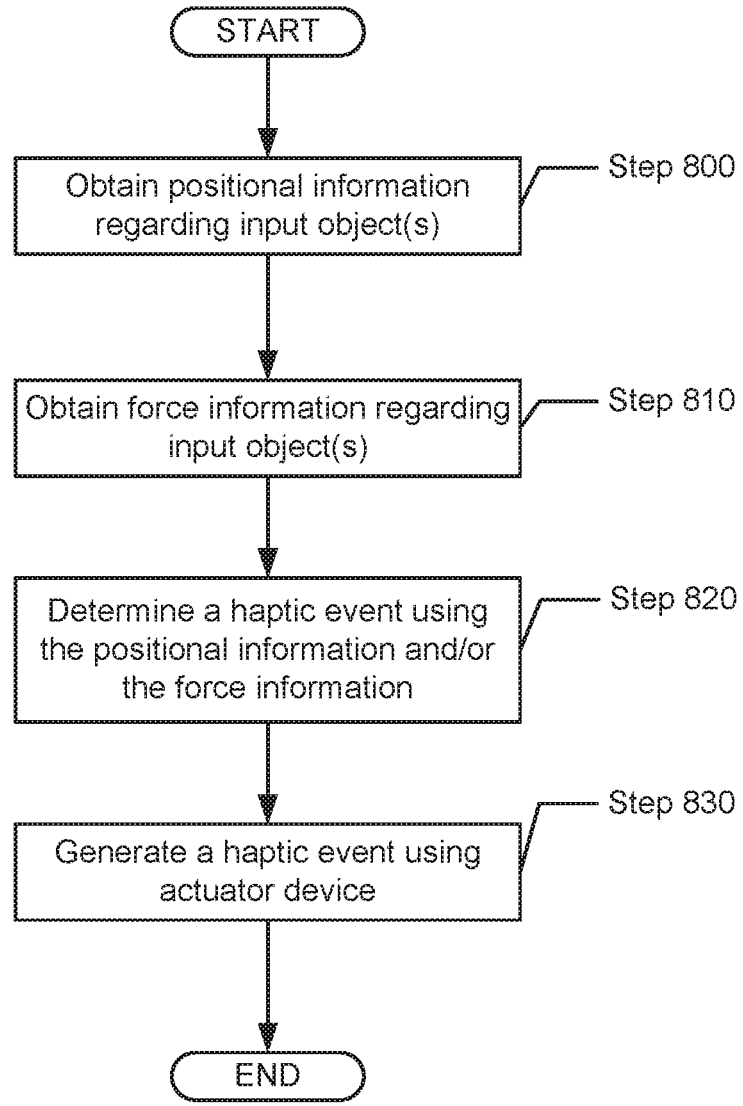
FIG. 8 shows a flowchart in accordance with one or more embodiments.

Turning to FIG. 8, FIG. 8 shows a flowchart in accordance with one or more embodiments. Specifically, FIG. 8 describes a method for generating haptic feedback. The process shown in FIG. 8 may involve, for example, one or more components discussed above in reference to FIGS. 1-7 (e.g., processing system (110)). While the various steps in FIG. 8 are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 800, positional information is obtained regarding one or more input objects in accordance with one or more embodiments. Specifically, positional information may be obtained from various sensor electrodes as described in FIGS. 1 and 2 and the accompanying description. For example, the positional information may be obtained using an input device to detect the position of an input object in a sensing region. Thus, the positional information may describe one or more positions of the input object within a sensing region, such as an initial position of the input object at one point in time and a final position of the input object at a later point in time.

In Step 810, force information is obtained regarding one or more input objects in accordance with one or more embodiments. Specifically, the force information regarding the input force may be obtained from various sensor electrodes as described in FIGS. 1 and 2 and the accompanying description. For example, in response to an application of an input force by an input object to an input device, a processing system may determine whether the input force exceeds one or more force thresholds using one or more resulting signals obtained from various sensor electrodes. In one or more embodiments, for example, a force threshold is defined by the processing system according to whether one or more force values exceed a specified limit. Thus, the processing system may compare the force values from an input force to the force values designated by a particular force threshold to determine whether the input force exceeds the force threshold. As such, the force information may include actual force values and/or relative force values, e.g., whether the force values exceed a particular force threshold.

In one or more embodiments, the force information is obtained from an input device that includes one or more force receiver electrodes. For example, the force receiver electrodes may detect changes in capacitance resulting from one or more input forces applied to an input surface by one or more input objects. In one or more embodiments, for example, the force receiver electrodes capacitively couple with various transmitter sensor electrodes and/or proximity sensor electrodes. The force receiver electrodes may form various areas of variable capacitance between the force receiver electrodes and some of the transmitter sensor electrodes and/or proximity sensor electrodes. By applying an input force to an input surface, force receiver electrodes may deflect towards the transmitter electrodes and/or the proximity sensor electrodes, changing the relative distance, and thus changing the variable capacitance. In particular, the magnitude of the change in the variable capacitance may be related to the magnitude of the force. In one or more embodiments, a processing system may obtain force information based on resulting signals obtained from the force receiver electrodes.

In Step 820, a haptic event is determined using positional information and/or force information in accordance with one or more embodiments. In one or more embodiments, for example, the haptic event provides physical feedback to a user using an input device. For example, the haptic event may be a physical response that resembles a vibration and/or physical resistance experienced by a user of an input device. In one or more embodiments, for example, the haptic event is configured to emulate a physical response produced using a tactile switch.

Furthermore, the type of haptic event may be determined based on the positional information from Step 800 and/or the force information from Step 810. For example, an input object detected at different locations in a sensing region may result in different types of haptic feedback for a user. On the other hand, a force threshold may be applied to the force information from Step 810. For example, haptic feedback may not occur unless a specific force threshold is exceeded by an input force applied by an input object to an input surface.

In one or more embodiments, different haptic events occur based on different positional information with respect to similar force information. For example, within a graphical user interface (GUI), a haptic event may occur when a user scrolls a cursor over a threshold, an edge of a GUI window, or onto a button within the GUI. The haptic event may be a singular "bump" sensation produced by a single motion of a moveable substrate. Likewise, when a cursor reaches an edge or a barrier within a GUI, a "vibratory alarm" may be experienced by the user. In this example, a "vibratory alarm" may correspond to multiple movement cycles performed by an actuator device with respect to a moveable substrate. Thus, movement of the moveable substrate in a moveable direction may produce a sheering motion on an input device. This sheering motion may, for example, emulate a button press sensation for a user.

Furthermore, in one or more embodiments, various types of haptic events may be generated using multiple movement cycles. For example, different frequencies and/or different beat patterns may be generated through multiple actuator forces being applied directly and/or indirectly to a moveable substrate.

In Step 830, a haptic event is generated using an actuator device in accordance with one or more embodiments. In one or more embodiments, for example, the haptic event as determined in Step 820 corresponds to one or more displacements of a moveable substrate as described in FIG. 2 and the accompanying description. In one or more embodiments, for example, the moveable substrate may be similar to mounting plate A (360), mounting plate B (460), and/or mounting plate C (560) as discussed in FIGS. 3-5 and the accompanying description. In particular, an actuator device may be similar to actuator device (245) from FIG. 2. As such, the actuator device may apply one or more actuator forces to the moveable substrate to produce the haptic event determined in Step 820.

Embodiments may be implemented on a computing system. Any combination of mobile, desktop, server, router, switch, embedded device, or other types of hardware may be used. For example, as shown in FIG. 9.1, the computing system (900) may include one or more computer processors (902), non-persistent storage (904) (e.g., volatile memory, such as random access memory (RAM), cache memory), persistent storage (906) (e.g., a hard disk, an optical drive such as a compact disk (CD) drive or digital versatile disk (DVD) drive, a flash memory, etc.), a communication interface (912) (e.g., Bluetooth interface, infrared interface, network interface, optical interface, etc.), and numerous other elements and functionalities.

The computer processor(s) (902) may be an integrated circuit for processing instructions. For example, the computer processor(s) may be one or more cores or micro-cores of a processor. The computing system (900) may also include one or more input devices (910), such as a touchscreen, keyboard, mouse, microphone, touchpad, electronic pen, or any other type of input device.

The communication interface (912) may include an integrated circuit for connecting the computing system (900) to a network (not shown) (e.g., a local area network (LAN), a wide area network (WAN) such as the Internet, mobile network, or any other type of network) and/or to another device, such as another computing device.

Further, the computing system (900) may include one or more output devices (908), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (902), non-persistent storage (904), and persistent storage (906). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the invention.

The computing system (900) in FIG. 9.1 may be connected to or be a part of a network. For example, as shown in FIG. 9.2, the network (920) may include multiple nodes (e.g., node X (922), node Y (924)). Each node may correspond to a computing system, such as the computing system shown in FIG. 9.1, or a group of nodes combined may correspond to the computing system shown in FIG. 9.1. By way of an example, embodiments of the invention may be implemented on a node of a distributed system that is connected to other nodes. By way of another example, embodiments of the invention may be implemented on a distributed computing system having multiple nodes, where each portion of the invention may be located on a different node within the distributed computing system. Further, one or more elements of the aforementioned computing system (900) may be located at a remote location and connected to the other elements over a network.

Although not shown in FIG. 9.2, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (922), node Y (924)) in the network (920) may be configured to provide services for a client device (926). For example, the nodes may be part of a cloud computing system. The nodes may include functionality to receive requests from the client device (926) and transmit responses to the client device (926). The client device (926) may be a computing system, such as the computing system shown in FIG. 9.1. Further, the client device (926) may include and/or perform all or a portion of one or more embodiments of the invention.

The computing system or group of computing systems described in FIGS. 9.1 and 9.2 may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, only one authorized process may mount the shareable segment, other than the initializing process, at any given time.

Other techniques may be used to share data, such as the various data described in the present application, between processes without departing from the scope of the invention. The processes may be part of the same or different application and may execute on the same or different computing system.

Rather than or in addition to sharing data between processes, the computing system performing one or more embodiments of the invention may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the invention, may extract one or more data items from the obtained data. For example, the extraction may be performed as follows by the computing system (900) in FIG. 9.1. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 9.1, while performing one or more embodiments of the invention, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments of the invention, A and B may be vectors, and comparing A with B requires comparing the first element of vector A with the first element of vector B, the second element of vector A with the second element of vector B, etc. In one or more embodiments, if A and B are strings, the binary values of the strings may be compared.

The computing system in FIG. 9.1 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or a data container (e.g., database, table, record, column, view, etc.), identifier(s), conditions (comparison operators), functions (e.g., join, full join, count, average, etc.), sort (e.g., ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 9.1 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions present only a few examples of functions performed by the computing system of FIG. 9.1 and the nodes and/or client device in FIG. 9.2. Other functions may be performed using one or more embodiments of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An input device comprising:
   a wire element;
   a moveable substrate coupled to the wire element, the moveable substrate comprising a plurality of wire alignment features and a plurality of wire capturing features;
   an input surface disposed above the moveable substrate;
   a plurality of sensor electrodes coupled to the input surface; and
   a haptic actuator coupled to the moveable substrate, the haptic actuator configured to displace the moveable substrate in a first direction substantially parallel to a plane of the input surface,
   wherein the wire element is configured to return the moveable substrate to an original position, and
   wherein the plurality of wire alignment features is configured to:
      allow, in response to an applied force by the haptic actuator and to the moveable substrate, a first displacement of the moveable substrate in the first direction, and
      prevent a third displacement of the moveable substrate, the third displacement in a third direction substantially perpendicular to the first direction and parallel to the plane of the input surface, and
   wherein the plurality of wire capturing features is configured to prevent a second displacement of the moveable substrate, the second displacement in a second direction substantially perpendicular to the plane of the input surface.

2. The input device of claim 1,
   wherein the first direction corresponds to a y-axis of the input device,
   wherein the second direction corresponds to a z-axis of the input device, and
   wherein the third direction corresponds to an x-axis of the input device.

3. The input device of claim 1,
   wherein the plurality of wire capturing features comprise a hook-shaped structure extending away from the input surface,
   wherein the hook-shaped structure is configured to provide, while the applied force is produced by the haptic actuator, a mechanical connection between the wire element and the moveable substrate, and
   wherein the hook-shaped structure is configured to avoid contact substantially with the wire element while the haptic actuator displaces the moveable substrate.

4. The input device of claim 1, further comprising:
   a housing; and
   a rigid substrate coupled to the housing,
   wherein the haptic actuator is coupled to the rigid substrate, and
   wherein the haptic actuator is disposed on a side of the moveable substrate that is facing away from the input surface.

5. The input device of claim 1,
   wherein the moveable substrate comprises a plastic material, and
   wherein the wire element is a mounting wire that is insert molded into the moveable substrate.

6. The input device of claim 1, wherein the haptic actuator is a shape memory alloy haptic actuator.

7. The input device of claim 1, wherein the haptic actuator is configured to displace the moveable substrate in response to the plurality of sensor electrodes detecting an input force applied to the input surface.

8. The input device of claim 1,
   wherein the plurality of alignment features comprise a first physical tab coupled with the wire element and disposed proximate a first edge of the moveable substrate.

9. The input device of claim 8,
   wherein the plurality of alignment features comprise a second physical tab coupled with the wire element,
   wherein the first physical tab is disposed proximate a first edge of the moveable substrate,
   wherein the second physical tab is disposed proximate a second edge of the moveable substrate, and
   wherein the first edge of the moveable substrate is remote from the second edge of the moveable substrate.

10. An electronic system comprising:
    a housing; and
    an input device comprising:
       a wire element coupled to the housing;
       a moveable substrate coupled to the wire element, the moveable substrate comprising a plurality of wire alignment features and a plurality of wire capturing features;
       an input surface disposed above the moveable substrate;
       a plurality of sensor electrodes coupled to the input surface; and
       a haptic actuator coupled to the moveable substrate, the haptic actuator configured to displace the moveable substrate in a first direction substantially parallel to a plane of the input surface, wherein the wire element is configured to return the moveable substrate to an original position, and wherein the plurality of wire alignment features is configured to:

allow, in response to an applied force by the haptic actuator and to the moveable substrate, a first displacement of the moveable substrate in the first direction, and prevent a third displacement of the moveable substrate, the third displacement in a third direction substantially perpendicular to the first direction and parallel to the plane of the input surface, and wherein the plurality of wire capturing features is configured to prevent a second displacement of the moveable substrate, the second displacement in a second direction substantially perpendicular to the plane of the input surface; and a processing system communicatively coupled to the input device and configured to:

determine, using the plurality of sensor electrodes, positional information of an input object in a sensing region or force information of an input force applied to the input surface, and cause the haptic actuator to produce the first displacement of the moveable substrate in the first direction in response to the positional information or the force information.

11. The electronic system of claim 10,
wherein the first direction corresponds to a y-axis of the input device,
wherein the second direction corresponds a z-axis of the input device, and
wherein the third direction corresponds to an x-axis of the input device.

12. The electronic system of claim 10,
wherein the plurality of wire capturing features comprise a hook-shaped structure extending above the moveable substrate and toward the input surface,
wherein the hook-shaped structure is configured to provides, while the applied force is produced by the haptic actuator, a mechanical connection between the wire element and the moveable substrate, and
wherein the hook-shaped structure is configured to avoid contact substantially with the wire element while the haptic actuator displaces the moveable substrate.

13. The electronic system of claim 10, further comprising:
a housing; and
a chassis coupled to the housing,
wherein the haptic actuator is coupled to the chassis, and
wherein the haptic actuator is disposed on a side of the moveable substrate that is facing away from the input surface.

14. The electronic system of claim 10,
wherein the moveable substrate comprises a plastic material, and
wherein the wire element is a mounting wire that is insert molded into the moveable substrate.

15. The electronic system of claim 10, wherein the haptic actuator is a shape memory alloy haptic actuator.

16. The electronic system of claim 10, wherein the first displacement of the moveable substrate produces a physical feedback with the input device that is substantially similar to a tactile switch.

17. The electronic system of claim 10, wherein the plurality of alignment features comprise a first physical tab coupled with the wire element and disposed proximate a first edge of the moveable substrate.

18. The electronic system of claim 17,
wherein the plurality of alignment features comprise a second physical tab coupled with the wire element,
wherein the first physical tab is disposed proximate a first edge of the moveable substrate,
wherein the second physical tab is disposed proximate a second edge of the moveable substrate, and
wherein the first edge of the moveable substrate is remote from the second edge of the moveable substrate.

* * * * *